United States Patent
Ko et al.

(10) Patent No.: US 12,289,910 B2
(45) Date of Patent: *Apr. 29, 2025

(54) DEVICE FOR HIGH VOLTAGE APPLICATIONS

(71) Applicant: GLOBALFOUNDRIES Singapore Pte. Ltd., Singapore (SG)

(72) Inventors: Kwangsik Ko, Singapore (SG); Qiuyi Xu, Singapore (SG); Shajan Mathew, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/388,214

(22) Filed: Nov. 9, 2023

(65) Prior Publication Data
US 2024/0072109 A1    Feb. 29, 2024

Related U.S. Application Data

(63) Continuation of application No. 17/548,624, filed on Dec. 13, 2021, now Pat. No. 11,862,673.

(51) Int. Cl.
| | |
|---|---|
| *H10D 62/10* | (2025.01) |
| *H01L 21/761* | (2006.01) |
| *H01L 21/765* | (2006.01) |
| *H10D 8/01* | (2025.01) |
| *H10D 8/60* | (2025.01) |
| *H10D 64/00* | (2025.01) |

(52) U.S. Cl.
CPC ......... *H10D 62/107* (2025.01); *H01L 21/761* (2013.01); *H01L 21/765* (2013.01);
(Continued)

(58) Field of Classification Search
CPC . H01L 29/0623; H01L 21/761; H01L 21/765; H01L 29/402; H01L 29/66143;
(Continued)

(56) References Cited

U.S. PATENT DOCUMENTS 7,968,908 B2 *  6/2011  Abou-Khalil ....... H01L 27/0262
                                                    257/E29.174
9,362,266 B1 *  6/2016  Lee .................... H01L 27/02
(Continued)

OTHER PUBLICATIONS

Examination Report of parallel German patent application No. 10 2022 130 006.4 dated Mar. 26, 2024, 6 pages, for information purpose only.
(Continued)

*Primary Examiner* — Khaja Ahmad
*Assistant Examiner* — Khatib A Rahman
(74) *Attorney, Agent, or Firm* — VIERING JENTSCHURA & PARTNER MBB

(57) ABSTRACT

A device includes a buried oxide layer disposed on a substrate, a first region disposed on the buried oxide layer and a first ring region disposed in the first region. The first ring region includes a portion of a guardring. The device further includes a first terminal region disposed in the first ring region, a second ring region disposed in the first region and a second terminal region disposed in the second ring region. The first terminal region is connected to an anode and the second terminal region is connected to a cathode. The first region has a graded doping concentration. The first region, the second ring region and the second terminal region have a first conductivity type, and the first ring region and the first terminal region have a second conductivity type. The first conductivity type is different from the second conductivity type.

20 Claims, 13 Drawing Sheets

(52) U.S. Cl.
CPC ............... *H10D 8/051* (2025.01); *H10D 8/60* (2025.01); *H10D 64/111* (2025.01)

(58) Field of Classification Search
CPC ............... H01L 29/872; H01L 29/0692; H01L 29/66136; H01L 29/861; H01L 29/0619; H01L 29/0649; H01L 29/063; H01L 29/0684; H01L 29/36
See application file for complete search history.

(56) References Cited

U.S. PATENT DOCUMENTS

| | | | | |
|---|---|---|---|---|
| 2006/0125040 A1* | 6/2006 | Levin | ................... | H01L 29/872 257/E27.068 |
| 2006/0234439 A1 | 10/2006 | Howard et al. | | |
| 2009/0057770 A1* | 3/2009 | Pang | ................... | H01L 27/0629 257/E21.632 |
| 2010/0164050 A1* | 7/2010 | Ho | ........................ | H01L 29/872 257/E29.338 |
| 2012/0211869 A1* | 8/2012 | Lee | ..................... | H01L 27/0255 257/547 |
| 2021/0384361 A1 | 12/2021 | Han | | |
| 2023/0170383 A1* | 6/2023 | Kim | ..................... | H01L 29/0619 257/494 |

OTHER PUBLICATIONS

Merchant, "Analytical Model for the Electric Field Distribution in SOI RESURF and TMBS Structures", IEEE Transactions on Electron Devices, 1999, pp. 1264-1267, vol. 46, No. 6, IEEE.

* cited by examiner

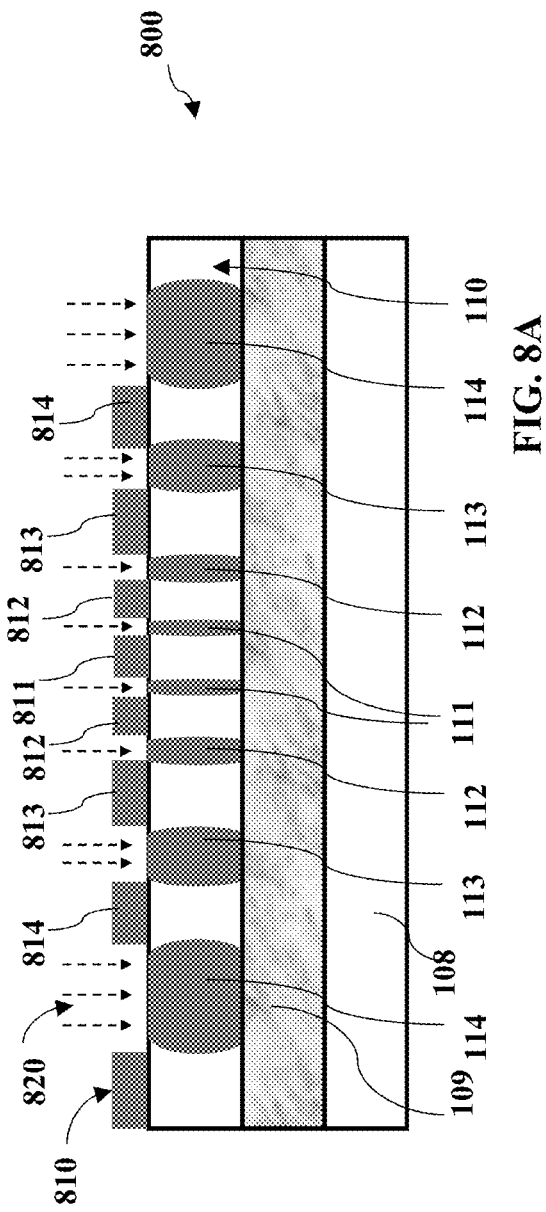
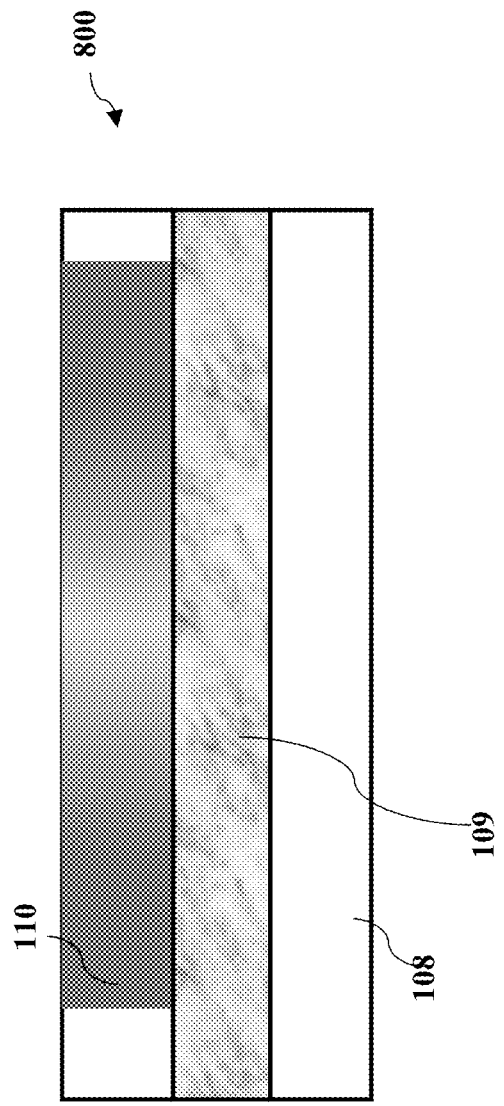
FIG. 8A
FIG. 8B

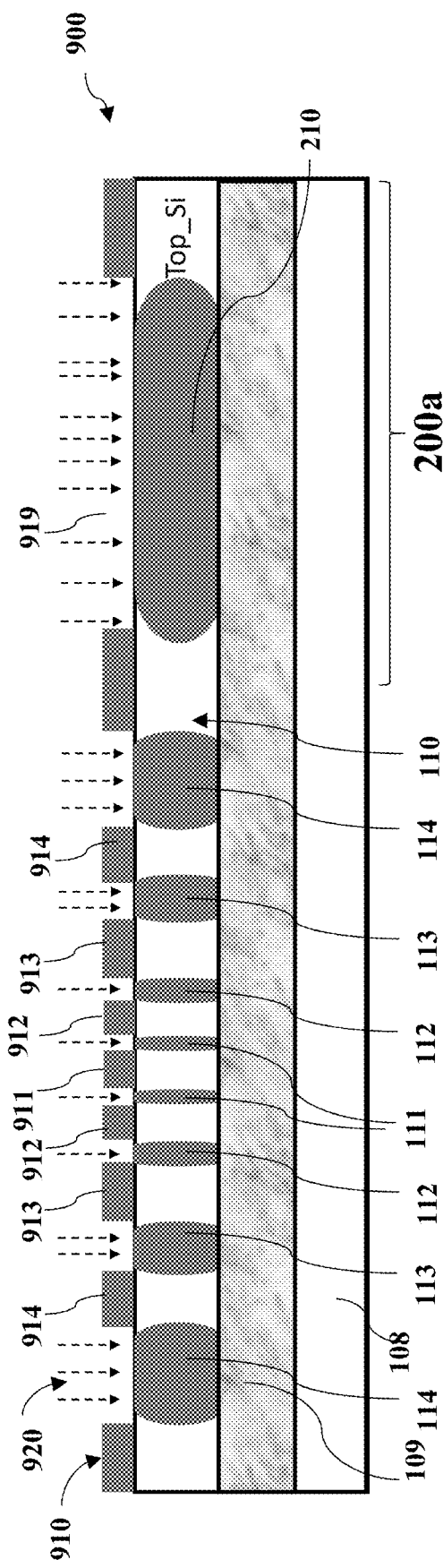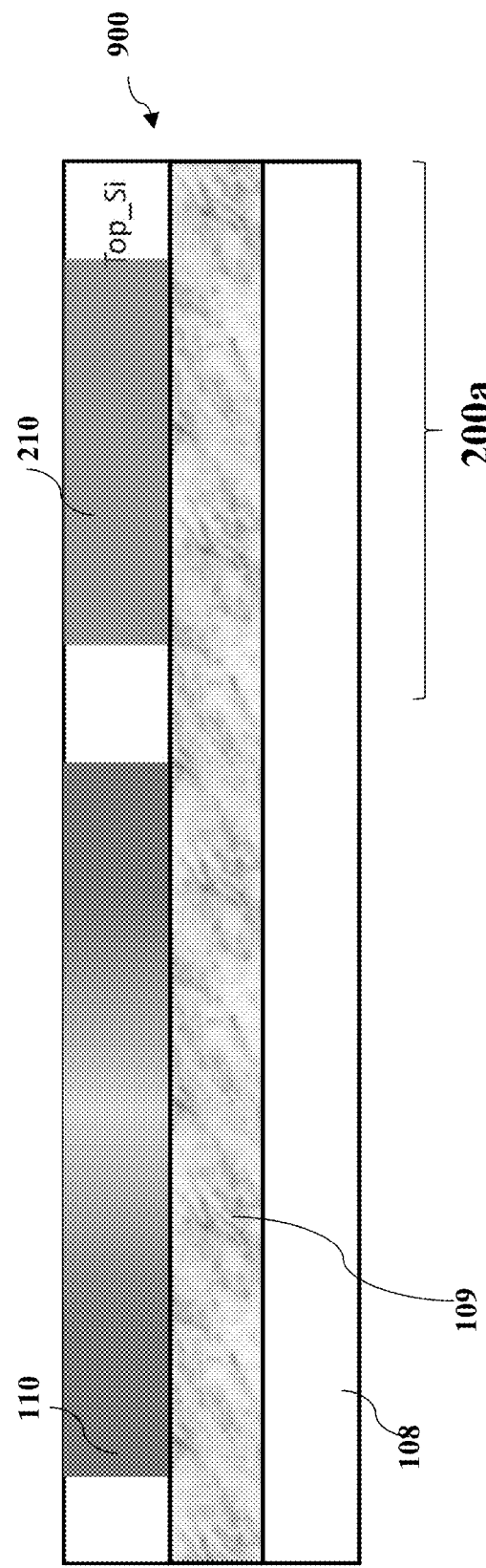
FIG. 10A
FIG. 10B

DEVICE FOR HIGH VOLTAGE APPLICATIONS

CROSS REFERENCE TO RELATED APPLICATIONS

This application is a Continuation application and claims priority to U.S. application Ser. No. 17/548,624 filed on Dec. 13, 2021, which is incorporated by reference herein in its entirety.

TECHNICAL FIELD

The present disclosure relates generally to a device for high voltage applications, in particular, a Schottky diode device.

BACKGROUND

The Schottky diode is a semiconductor diode formed by the junction of a semiconductor with a metal.

There is a need to enhance the breakdown voltages of Schottky diodes for high voltage applications.

SUMMARY

According to an aspect of the present disclosure, there is provided a device including: a buried oxide layer disposed on a substrate; a first region disposed on the buried oxide layer; a first ring region disposed in the first region, the first ring region comprising a portion of a guardring; a first terminal region disposed in the first ring region, the first terminal region being connected to an anode; a second ring region disposed in the first region; a second terminal region disposed in the second ring region, the second terminal region being connected to a cathode; wherein the first region has a graded doping concentration; wherein the first region, the second ring region, and the second terminal region have a first conductivity type; wherein the first ring region and the first terminal region have a second conductivity type; and wherein the first conductivity type is different from the second conductivity type.

According to an aspect of the present disclosure, there is provided a method for manufacturing a device, including: providing a buried oxide layer on a substrate; providing a first region on the buried oxide layer; providing a first ring region and a second ring region in the first region; and providing a first terminal region disposed in the first ring region and a second terminal region in the second ring region, the first terminal region being connected to an anode and the second terminal region being connected to a cathode, wherein providing the first region comprises: using a photoresist mask when doping the first region; and annealing the first region after doping the first region; wherein the photoresist mask has a plurality of concentric rings; and wherein the first region, the second ring region, and the second terminal region have a first conductivity type; wherein the first ring region and the first terminal region have a second conductivity type; and wherein the first conductivity type is different from the second conductivity type.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same features throughout the different drawings. Also, the drawings are not necessarily to scale, emphasis instead generally being placed upon illustrating the principles of the disclosure. Embodiments of the disclosure will now be illustrated for the sake of example only with reference to the following drawings, in which:

FIGS. 8A to 8D show simplified cross-sectional views that illustrate a method for fabricating the device of FIG. 2;

FIGS. 10A to 10D show simplified cross-sectional views that illustrate a method for fabricating the device of FIG. 9.

DETAILED DESCRIPTION

Figure 1:
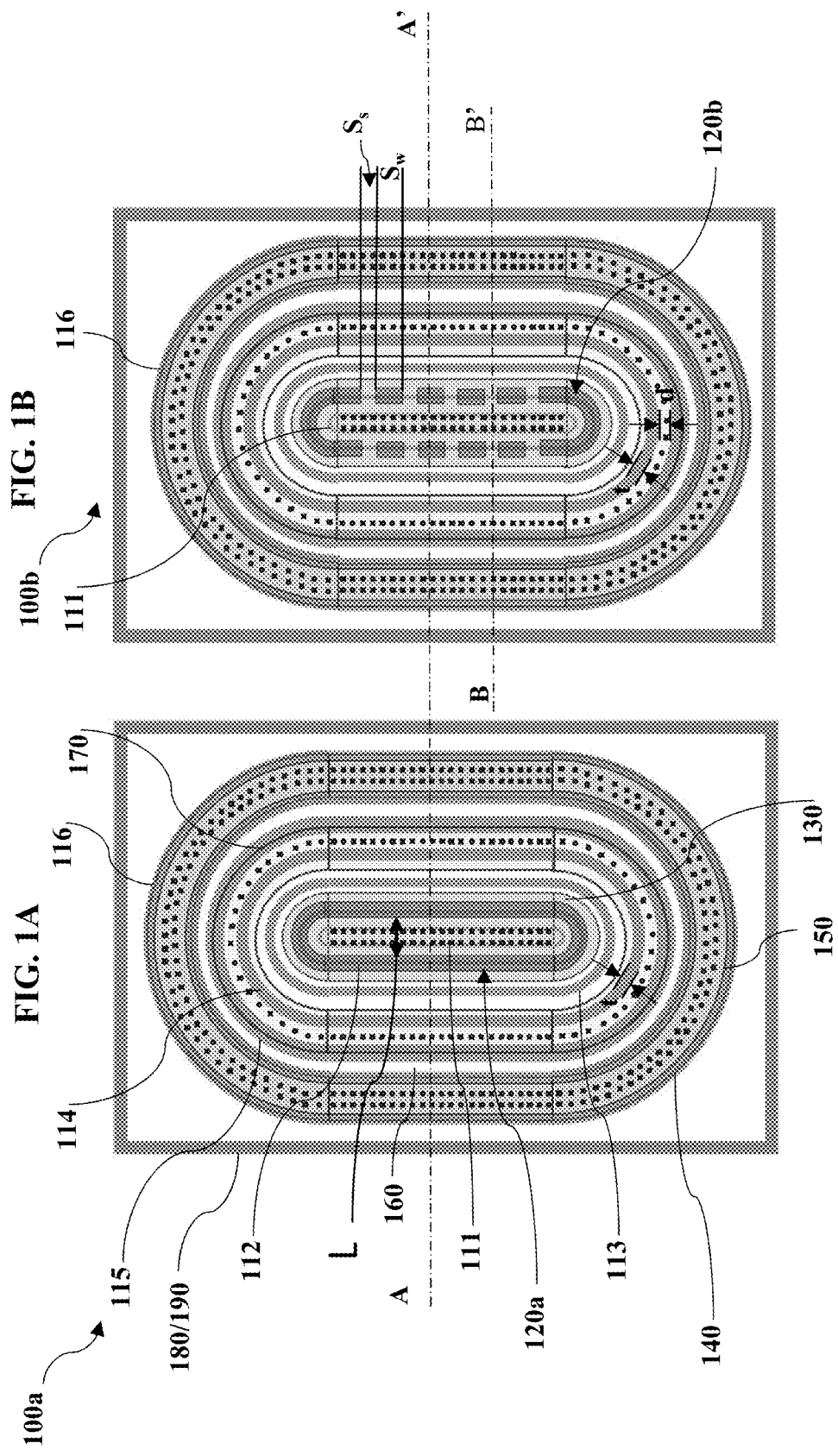
FIGS. 1A and 1B show top views of devices for high voltage applications according to various embodiments of the present disclosure.

Embodiments generally relate to semiconductor devices. More particularly, some embodiments relate to Schottky diode devices.

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the disclosure, are given by way of illustration only, and are not by way of limitation. Various substitutions, modifications, additions, and/or arrangements, within the spirit and/or scope of the underlying inventive concepts will be apparent to those skilled in the art from this disclosure.

The non-limiting embodiments described below in context of the devices are analogously valid for the respective methods, and vice versa. Furthermore, it will be understood that the embodiments described below may be combined; for example, a part of one embodiment may be combined with a part of another embodiment.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. The word "or" is intended to include "and" unless the context clearly indicates otherwise.

The terminology used herein is for the purpose of describing particular examples only and is not intended to be limiting of the disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

It should be understood that the terms "on", "over", "top", "bottom", "down", "side", "back", "left", "right", "front", "lateral", "vertical", "side", "up", "down" etc., when used in the following description are used for convenience and to aid understanding of relative positions or directions, and not intended to limit the orientation of any device, or structure or any part of any device or structure. Similarly, the term "in" as used herein is not intended to limit a thing to be fully enclosed by something else. Further, the term "width" is intended to mean a length extending in the lateral direction with reference to the relevant drawings; the term "depth" is intended to mean a length extending in the vertical direction with reference to the relevant drawings.

As used herein, the term "connected," when used to refer to two physical elements, means a direct connection between the two physical elements. The term "coupled," however, can mean a direct connection or a connection through one or more intermediary elements. The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

According to various non-limiting embodiments, a device may include: a buried oxide layer disposed on a substrate; a first region disposed on the buried oxide layer; a first ring region disposed in the first region, the first ring region comprising a portion of a guardring; a first terminal region disposed in the first ring region, the first terminal region being connected to an anode; a second ring region disposed in the first region; a second terminal region disposed in the second ring region, the second terminal region being connected to a cathode; wherein the first region has a graded doping concentration; wherein the first region, the second ring region, and the second terminal region have a first conductivity type; wherein the first ring region and the first terminal region have a second conductivity type; and wherein the first conductivity type is different from the second conductivity type.

According to various non-limiting embodiments, the first region may have a rounded shape and the doping concentration of the first region may increase in a radial direction from a center of the first region to a perimeter of the first region.

According to various non-limiting embodiments, the first region may comprise a plurality of concentric ring portions that has been annealed, and the doping concentration of the first region may increase in a radial direction from a center ring portion to a perimeter ring portion.

According to various non-limiting embodiments, the plurality of the concentric ring portions may be located concentric with the first ring region and the second ring region.

According to various non-limiting embodiments, the first region may further comprise a plurality of substrate portions in between the plurality of concentric ring portions.

According to various non-limiting embodiments, the device may further comprise a first isolation region disposed in the first region, an inner edge of the first isolation region being in direct contact with the first ring region, an outer edge end of the first isolation region being in contact with the second terminal region and the second ring region.

According to various non-limiting embodiments, the device may further comprise a first field poly plate disposed over the first isolation region, the first field poly plate being connected to the anode.

According to various non-limiting embodiments, the first field poly plate may be disconnected with the first and second terminal regions.

According to various non-limiting embodiments, the first ring region may comprise a discontinuous guardring portion.

According to various non-limiting embodiments, the discontinuous guardring portion may comprise a plurality of guardring portions spaced apart by a plurality of gap portions.

According to various non-limiting embodiments, the plurality of guardring portions may have a length larger than a length of the plurality of gap portions.

According to various non-limiting embodiments, the device may further comprise a second isolation region at least partially disposed in the first region, the second isolation region extends laterally from the second ring region, a first end of the second isolation region being in direct contact with the second terminal region and the second region; and a deep isolation region in direct contact with the second isolation region and extending to the buried oxide layer.

According to various non-limiting embodiments, the device may further comprise a silicide layer disposed over the first terminal region, the first ring region and the first region, wherein the first terminal region is connected to the anode through the silicide layer.

According to various non-limiting embodiments, the device may further comprise a second region; a third region disposed in the second region, the third region being connected to a drain and in direct contact with the buried oxide layer; a third ring region disposed in the second region, the third ring region being connected to a source and in direct contact with the buried oxide layer; and a third isolation region disposed in the second region extending between the third region and the third ring region, the third isolation region being in direct contact with the third region, wherein a second end of the second isolation region is in direct contact with the third ring region; wherein the deep isolation region is located between the second ring region and the third ring region; wherein the second region and the third region have a first conductivity type; and wherein the third ring region has a second conductivity type.

According to various non-limiting embodiments, the device may further comprise a second field poly plate disposed over the third isolation region, the second region and the third ring region.

According to various non-limiting embodiments, the first, second terminal regions may comprise a first, second terminal ring regions.

According to various non-limiting embodiments, a doping concentration of the second ring region may be lower than a doping concentration of the first region.

According to various non-limiting embodiments, the first region may be a drift region.

According to various non-limiting embodiments, a method for manufacturing a device may include: providing a buried oxide layer on a substrate; providing a first region on the buried oxide layer; providing a first ring region and a second ring region in the first region; and providing a first terminal region disposed in the first ring region and a second terminal region in the second ring region, the first terminal region being connected to an anode and the second terminal region being connected to a cathode, wherein providing the first region comprises: using a photoresist mask when doping the first region; and annealing the first region after doping the first region; wherein the photoresist mask has a plurality of concentric rings; and wherein the first region, the second ring region, and the second terminal region have a first conductivity type; wherein the first ring region and the first terminal region have a second conductivity type; and wherein the first conductivity type is different from the second conductivity type.

Figure 2:
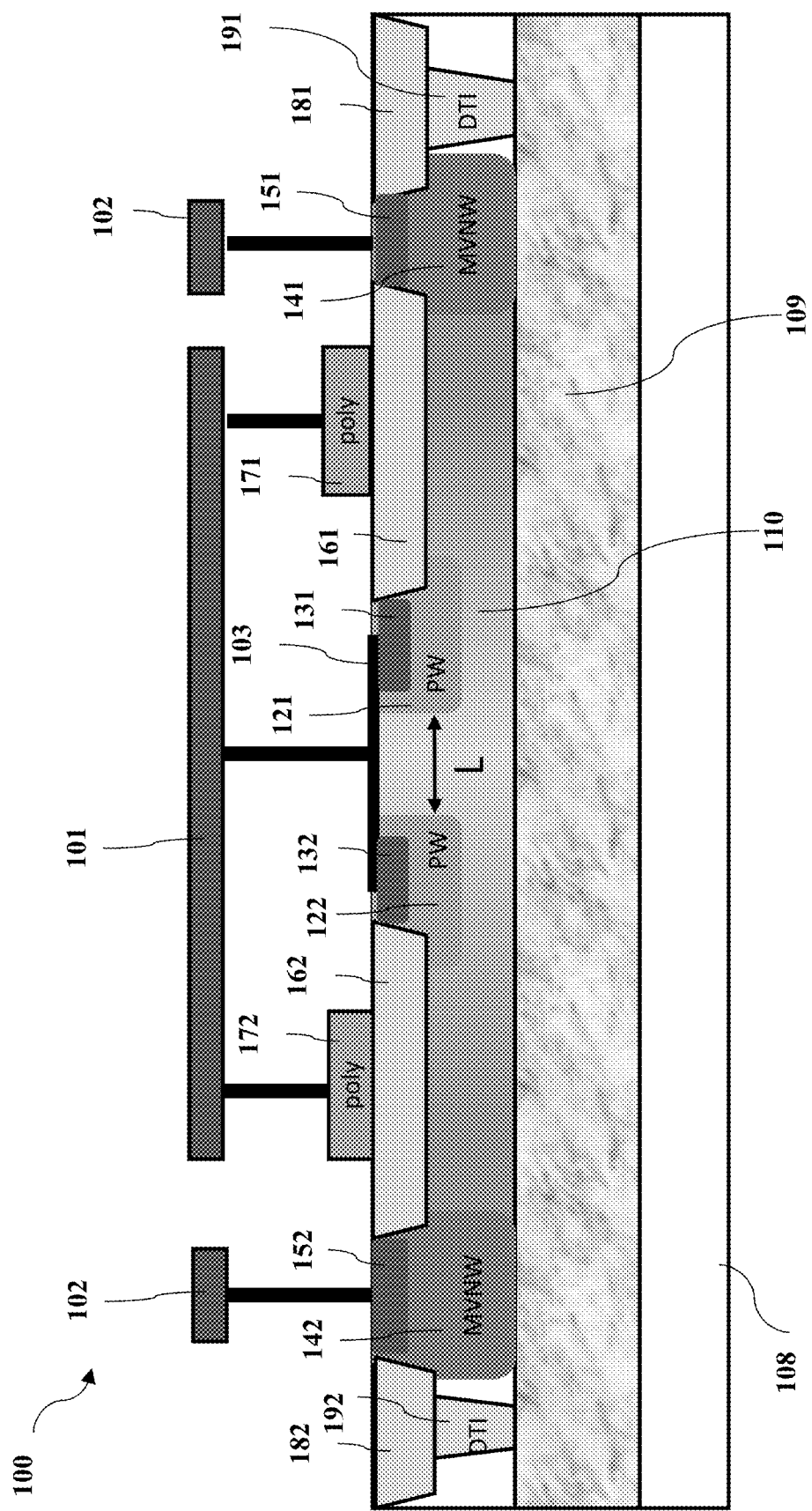
FIG. 2 shows a cross-sectional view of the devices of FIGS. 1A and 1B along the A-A' line.

FIG. 1A shows a top view of a device 100a and FIG. 1B shows a top view of a device 100b for high voltage applications according to various embodiments of the present disclosure. FIG. 2 shows a cross-sectional view of the device 100a and the device 100b (hereafter "the device 100") along the A-A' line. The device 100 will be described in details below with reference to FIGS. 1A and 1B and FIG. 2.

The device 100 may include a buried oxide layer 109 disposed on a substrate 108. The substrate 108 may be an Epitaxial (EPI) or Silicon-on-Insulator (SOI) substrate for high reverse breakdown voltages. The buried oxide layer 109 may isolate any regions disposed thereabove as introduced later from the substrate 108. The device 100 may further include a first region 110 disposed on the buried oxide layer 109, and a first ring region 120 (shown as 120a in FIGS. 1A and 120b in FIG. 1B) disposed in the first region 110, the first ring region 120 may be a well region. The first ring region 120 may include a portion of a guardring that is lightly doped to prevent leakage current under reverse state. Referring to FIG. 2, the first ring region 120, in a cross-sectional view, may include a first portion 121 and a second portion 122 of the first ring region 120.

The device 100 may further include a first terminal region 130 disposed in the first ring region 120, and the first terminal region 130 may be connected to an anode 101. The first terminal region 130 may also be a ring-shaped region. The first terminal region 130, in a cross-sectional view, may include a first portion 131 and a second portion 132 of the first terminal region 130 disposed in the first portion 121 and the second portion 122 of the first ring region 120, respectively.

The device 100 may further include a second ring region 140 at least partially disposed in the first region 110 and a second terminal region 150 disposed in the second ring region 140, and the second terminal region 150 may be connected to a cathode 102. The second ring region 140 may be a middle voltage well region that is low doped to obtain high reverse breakdown voltage in cathode area. Referring to FIG. 2, the second ring region 140, in a cross-sectional view, may include a first portion 141 and a second portion 142 of the second ring region 140. The second terminal region 150 may also be a ring-shaped region. The second terminal region 150, in a cross-sectional view, may include a first portion 151 and a second portion 152 of the second terminal region 150 disposed in the first portion 141 and the second portion 142 of the second ring region 140, respectively.

The second ring region 140 may surround the first ring region 120. The second ring region 140 may be spaced away from the first ring region 120. Additionally, the second ring region 140 may be concentric with the first ring region 120. Furthermore, the first ring region 120 may be disposed near a center of the first region 110 and the second ring region 140 may be disposed at or near a perimeter of the first region 110.

The first region 110, the second ring region 140, and the second terminal region 150 may have a first conductivity type, and the substrate 108, the first ring region 120 and the first terminal region 130 may have a second conductivity type, wherein the first conductivity type is different from the second conductivity type. In some embodiments, the first conductivity type may be n-type and the second conductivity type may be p-type.

The first region 110 may be a drift region and have a graded doping concentration. That is, the doping concentration of the first region 110 may vary across the first region 110 rather than being uniformly distributed throughout the first region 110. The first region 110 may have a rounded shape, for example a circle shape or an oval shape. The doping concentration of the first region 110 may increase in a radial direction from a center area of the first region 110 to a perimeter area of the first region 110. Said differently, the doping concentration of the first region 110 may be lowest at the center area of the first ring region 120 and may gradually increase in a direction moving towards the second ring region 140. To provide the graded doping concentration, different portions of the first region 110 may be implanted to have the doping concentration increase in a step-wise manner. That is, the first region 110 may include a plurality of concentric ring (or annulus) portions 111 to 116, and the doping concentration of the first region 110 may increase in a radial direction from a center ring portion 111 to a perimeter ring portion 116, as shown in FIGS. 1A and 1B. It should be appreciated that the "ring" or "annulus" portions are used herein to describe the general shape of the plurality of concentric ring (or annulus) portions 111 to 116. The "ring" or "annulus" portions may include discontinuities.

In an example, thicknesses of the ring portions may be in a range from 0.18 um to 2.5 um and the two adjacent ring portions may be spaced out by a distance in a range from 0.22 um to 3 um. A thickness of a respective ring portion is defined herein as the minimum distance between the inner perimeter and the outer perimeter of the ring portion, for example, the thickness of the ring portion 114 is denoted as "t" as shown in FIGS. 1A and 1B. A distance of the two consecutively adjacent ring portions including an inner ring portion and an outer ring portion is defined herein as the minimum distance between the inner perimeter of the outer ring portion and the outer perimeter of the inner ring portion, for example, the distance of the ring portion 115 is denoted as "d" as shown in FIG. 1B. A thickness of the ring portion 111 may be smaller than a thickness of the ring portion 112, the thickness of the ring portion 112 may be smaller than a thickness of the ring portion 113, the thickness of the ring portion 113 may be smaller than a thickness of the ring portion 114, the thickness of the ring portion 114 may be smaller than a thickness of the ring portion 115, and the thickness of the ring portion 115 may be smaller than a thickness of the ring portion 116.

The first region 110 may further include a plurality of substrate portions in between the plurality of concentric ring portions 111 to 116. A thickness of the substrate portion in between the ring portion 111 and the ring portion 112 may be smaller than or equal to a thickness of the substrate portion in between the ring portion 112 and the ring portion 113, and so forth. While six concentric ring portions have been presented herein, it should be appreciated that the number of concentric ring portions may be more or less than six, and the exemplary number of six is not intended to limit the scope, applicability or configuration of the claimed subject matter in any way.

The plurality of the concentric ring portions 111 to 116 may be substantially located concentric with the first ring region 120 and the second ring region 140. It should be appreciated that being concentric provides direct and quick current paths between the ring regions; however, the ring regions may not be concentric and instead eccentric with an inner ring region being at least partially enclosed by an outer ring region.

As will be discussed further herein, the first region 110 including the plurality of concentric ring portions 111-116 may be further annealed to provide a gradual graded doping. The concentric ring portions 111 to 116 may not be clearly defined after annealing which may depend on a distance between the adjacent ring portions and/or a thickness of the ring portion. The concentric ring portions 111 to 116 illustrated in FIGS. 1A-1B illustrate an example of a possible arrangement of the plurality of concentric ring portions 111-116 prior to annealing relative to the first ring region 120.

In an example, the first ring region 120 may include a continuous guardring portion 120a as shown in FIGS. 1A and 1n another example, the first ring region 120 may include a digitated discontinuous guardring portion 120b as shown in FIG. 1B. The device 100a may include the features of the device 100b except for the feature 120a whereas the device 100b has the different feature 120b as discussed herein. The digitated discontinuous guardring portion 120b may include a plurality of guardring portions spaced apart by a plurality of gap portions. The plurality of guardring portions may include multiple guardring portions having a same length (denoted as "$S_w$") and the multiple guardring portions having the same length may be arranged in two parallel lines. One of the multiple guardring portions in one of the parallel lines may be in alignment with another multiple guardring portion in the other of the parallel lines. The plurality of guardring portions may also include two half ring portions arranged at each end of the two parallel lines. The plurality of gap portions may have a same length (denoted as "S b") that is smaller than or equal to the length $S_w$ of the plurality of guardring portions. Greater details will be discussed below.

The device 100 may further include a first isolation region 160 disposed in the first region 110. The first isolation region 160 may be ring shaped. The isolation regions discussed herein may be shallow trench isolation (STI) or local oxidation of silicon (LOCOS) regions and have a cross-section of a trapezoid or a hexagonal prism. An inner edge of the first isolation region 160 may be in direct contact with the first ring region 120, and an outer edge end of the first isolation region 160 may be in direct contact with the second terminal region 140 and the second ring region 150. The inner edge of the first isolation region 160 may be spaced apart with the first terminal region 130 so as to reduce leakage under the off state.

Referring to FIG. 2, the first isolation region 160, in a cross-sectional view, may include a first portion 161 and a second portion 162 of the first isolation region 160. The first portion 161 of the first isolation region 160 extends between the first portion 131 of the first terminal region 130 and the first portion 151 of the second terminal region 150, and the second portion 162 of the first isolation region 160 extends between the second portion 132 of the first terminal region 130 and the second portion 152 of the second terminal region 150.

The device 100 may further include a first field poly plate 170 disposed over the first isolation region 160. The first field poly plate 170 may be ring shaped. The first field poly plate 170 may be connected to the anode 101 and disconnected with the first and second terminal regions 130, 150. The first field poly plate 170, in a cross-sectional view, may include a first portion 171 and a second portion 172 of the first field poly plate 170. The first portion 171 of the first field poly plate 170 is disposed over the first portion 161 of the first isolation region 160 and the second portion 172 of the first field poly plate 170 is disposed over the second portion 162 of the first isolation region 160.

The first, second terminal regions 130, 150 may include ring regions concentric with the first, second ring regions 120, 140. The first isolation region 160, the first field poly plate 170 may also include ring regions concentric with the first, second ring regions 120, 140.

The device 100 may further include a second isolation region 180 at least partially disposed in the first region 110. The second isolation region 180 may be ring shaped. The second isolation region 180 may extend laterally from the second ring region 140, a first end of the second isolation region 180 being in direct contact with the second terminal region 150 and the second region 140. In alternative embodiments, the first end of the second isolation region 180 may be spaced apart from the second terminal region 150 and the second region 140. The device 100 may further include a deep isolation region 190 in direct contact with the second isolation region 180 and extending to the buried oxide layer 109. The second isolation region 180, in a cross-sectional view, may include a first portion 181 and a second portion 182 of the second isolation region 180. The second isolation region 180 and the deep isolation region 190 may include a square region enclosing the first region 110, the first ring region 120 and the second ring region 140, thereby no leakage path through the substrate 108. The deep isolation region 190, in a cross-sectional view, may include a first portion 191 and a second portion 192 of the deep isolation region 190, with the first portion 191 in direct contact with the first portion 181 of the second isolation region 180 and the second portion 192 in direct contact with the second portion 182 of the second isolation region 180. The second isolation region 180 may be integrated with the deep isolation region 190 and have the same material composition.

The device 100 may further include a silicide layer 103 disposed over the first terminal region 130, the first ring region 120 and the first region 110, wherein the first terminal region 120 is connected to the anode 101 through the silicide layer 103. The silicide layer may help guide current flow to the anode 101.

In various non-limiting embodiments, the substrate 108 may include any silicon-containing substrate including, but not limited to, silicon (Si), single crystal silicon, polycrystalline Si, amorphous Si, Epitaxial (EPI) Si, silicon-onsapphire (SOS), silicon-on-insulator (SOI) or silicon-on-replacement insulator (SRI) or silicon germanium substrates and the like. The substrate 108 may in addition or instead include various isolations, dopings and/or device features. The substrate 108 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), gallium nitride (GaN), aluminium nitride (AlN), indium nitride (InN), and/or indium antimonide (InSb) or combinations thereof; an alloy semiconductor including GaAsP, AlInAs, GaInAs, GaInP, AlGaN, or GaInAsP, or combinations thereof.

Figure 3:
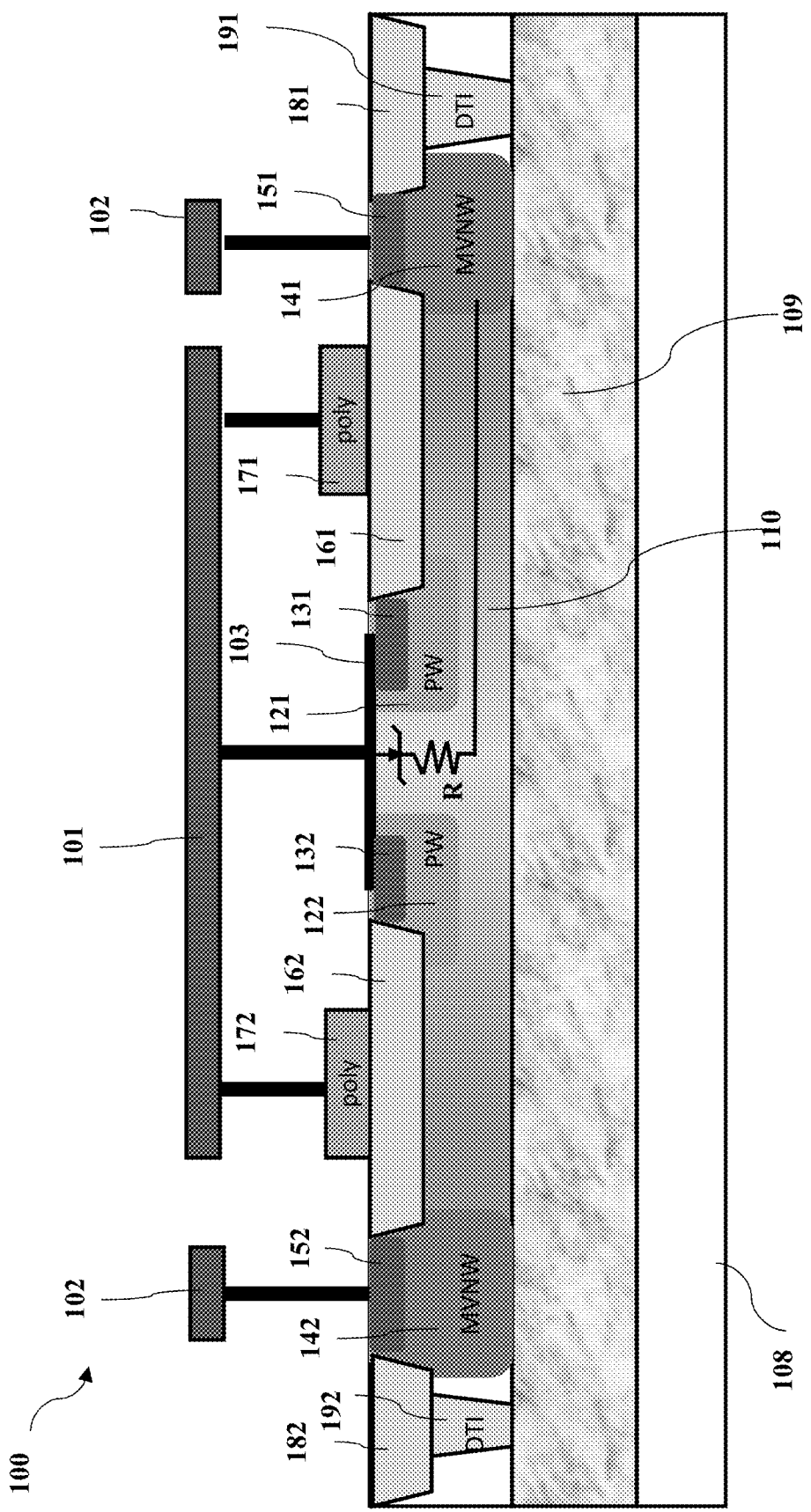
FIG. 3 shows a partial equivalent circuit of the device of FIG. 2.

FIG. 3 shows a partial equivalent circuit of the device 100. Graded doping concentration of the first region 110 provides a lower resistance R from the cathode 102 to the anode 101 and accordingly lower forwarding voltages and higher reverse breakdown voltages of the device 100. Furthermore, the buried oxide layer 109 disconnects the collector substrate 108 and therefore prevents a parasitic bipolar junction transistor (BJT) formed by the first terminal region 130, the first ring region 120, the first region 110 and the substrate 108. Additionally, double reduced-surface-field effect (RE-SURF) from the field poly plate 170 and the buried oxide layer 109 promotes higher reverse breakdown voltages.

Figure 4:
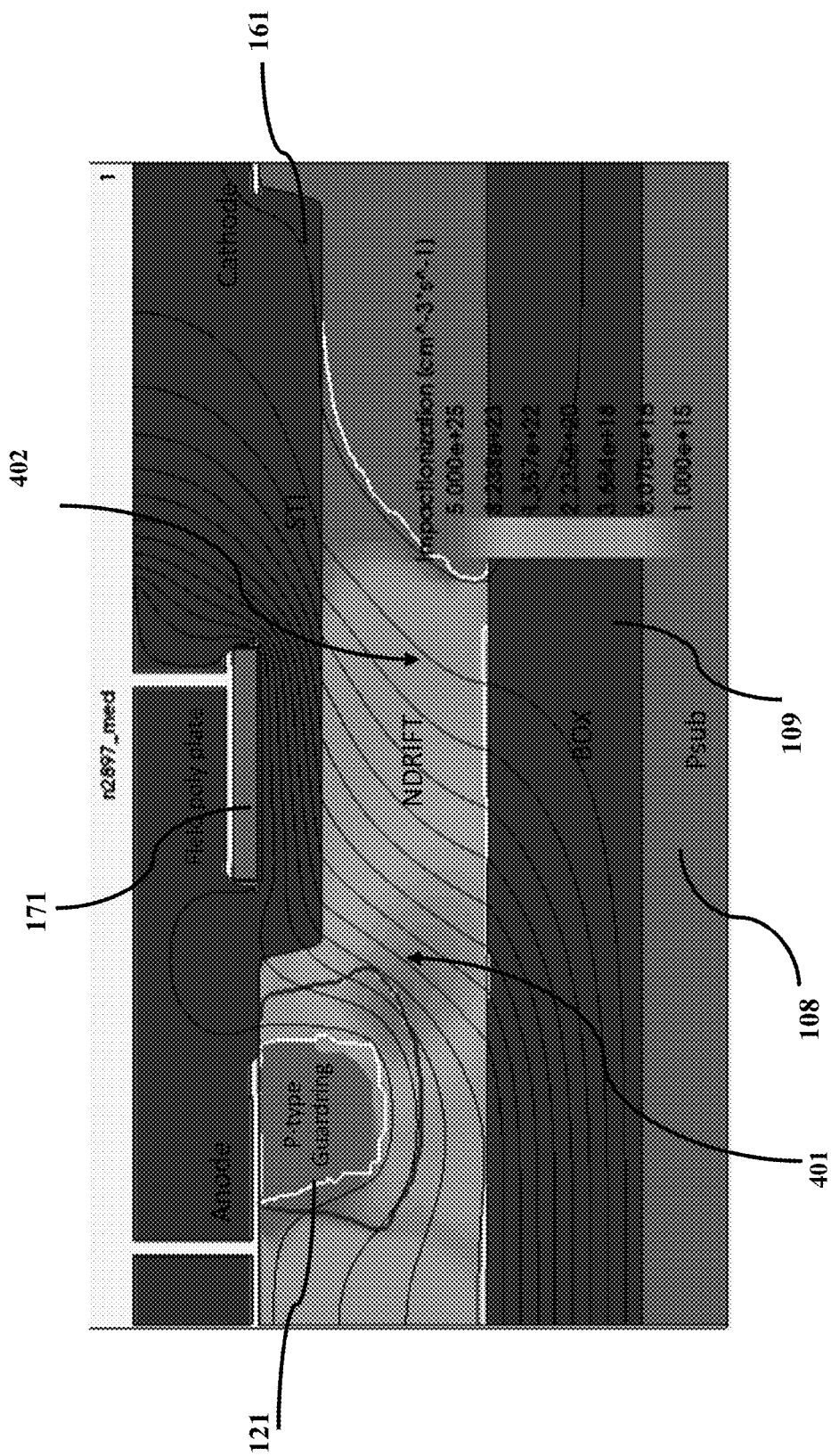
FIG. 4 shows simulated total current densities for the device of FIG. 2 in technology computer aided design (TCAD)

FIG. 4 shows simulated total current densities for the device 100 in technology computer aided design (TCAD). The intensive contours of total current density are present from the cathode 102 to the anode 101, with stronger currents 401 located at lower doping concentration ring portions of the first region 110 and weaker currents 402 located at higher doping concentration ring portions. RESURF can also been seen from FIG. 4.

Figure 5:
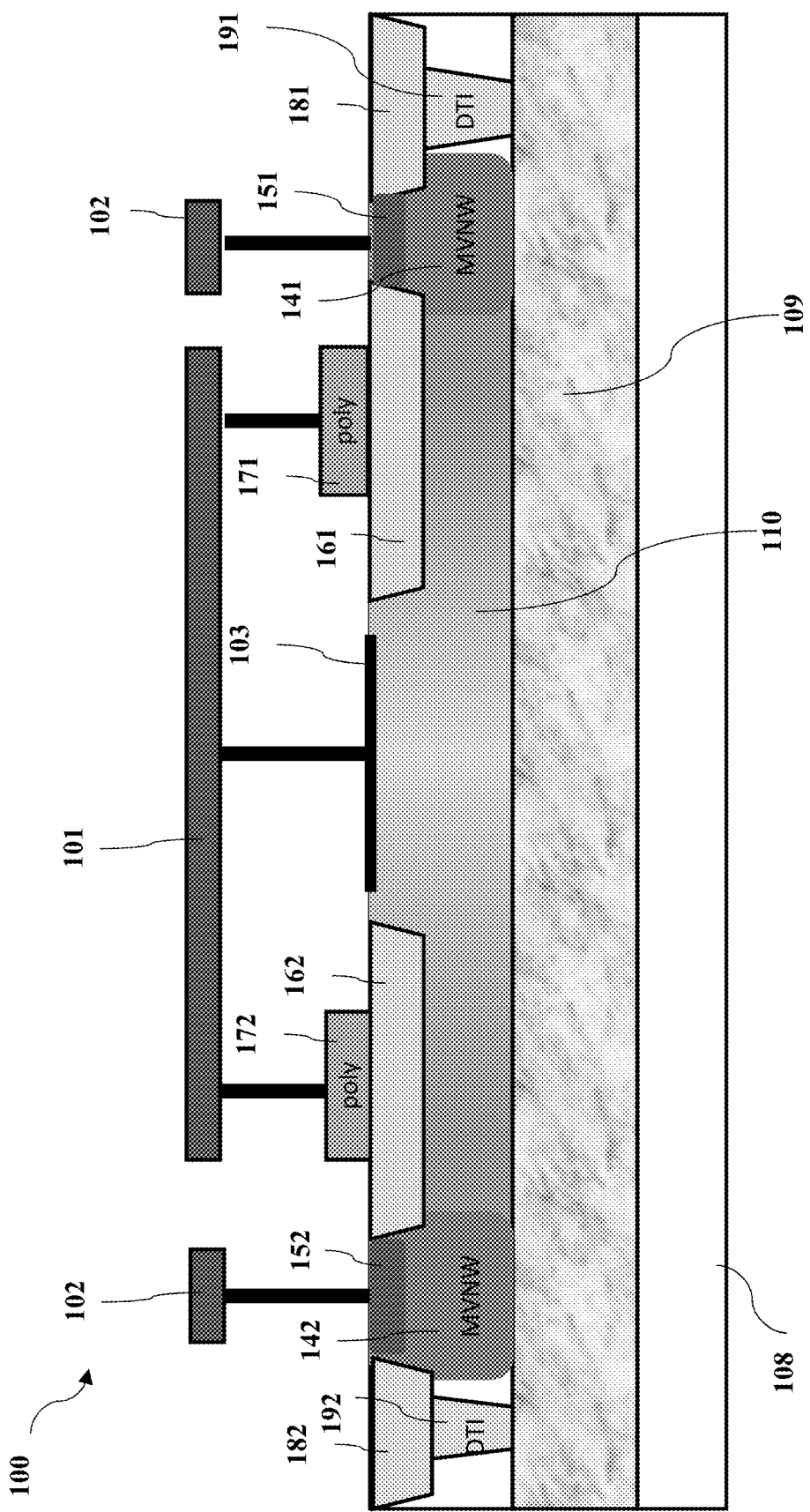
FIG. 5 shows a cross-sectional view of the device of FIG. 1B along the B-B' line.

FIG. 5 shows a cross section view of the device 100 along the B-B' line of FIG. 1(B) according to various embodiments of the present disclosure. The B-B' line comes across the gap portions of the first ring region 120 and accordingly, the first ring region 120 including the guardring portion is absent in FIG. 5.

Figure 6A:
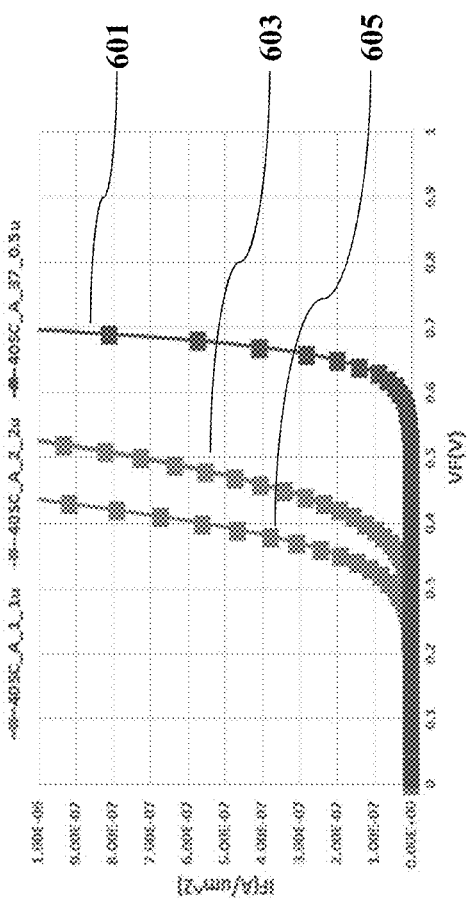
FIGS. 6A and 6B show the forwarding voltages and breakdown voltages of the device of FIG. 1(A), respectively.
Figure 6B:
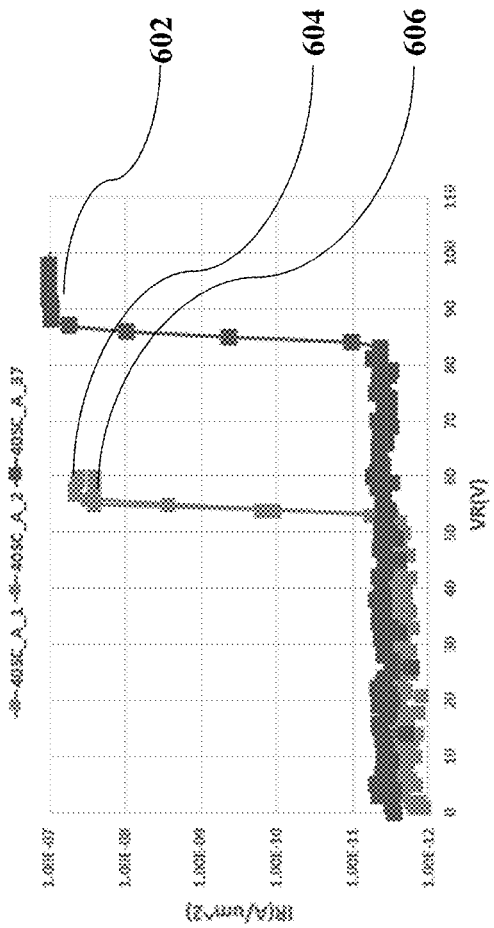

FIG. 6A shows the forwarding voltages of the device 100 of FIG. 1A and FIG. 6B shows the breakdown voltages of the device 100 of FIG. 1A, when the anode length (denoted as "L" in FIG. 1A and FIG. 2) is 0.5 um, 1 um and 2 um. As it can be seen from Graph 601 and Graph 602 when the anode length is 0.5 um, the forwarding voltage is 0.64V as the current is 0.1 uA and 0.70V as the current is 1 uA, and the breakdown voltage is 86V. As the anode length increases to 1 um and as seen from Graph 603 and Graph 604, the forwarding voltage is 0.4V as the current is 0.1 uA and 0.53V as the current is 1 uA, and the breakdown voltage is 54V. As the anode length further increases to 2 um and as seen from Graph 605 and Graph 606, the forwarding voltage is 0.33V as the current is 0.1 uA and 0.44V as the current is 1 uA, and the breakdown voltage is 54V. Accordingly, both the forwarding voltage and the breakdown voltage decrease as the anode length increases from 0.5 um to 2 um. Therefore, a suitable and optimum value of the anode length can be achieved from the present disclosure.

Figure 7A:
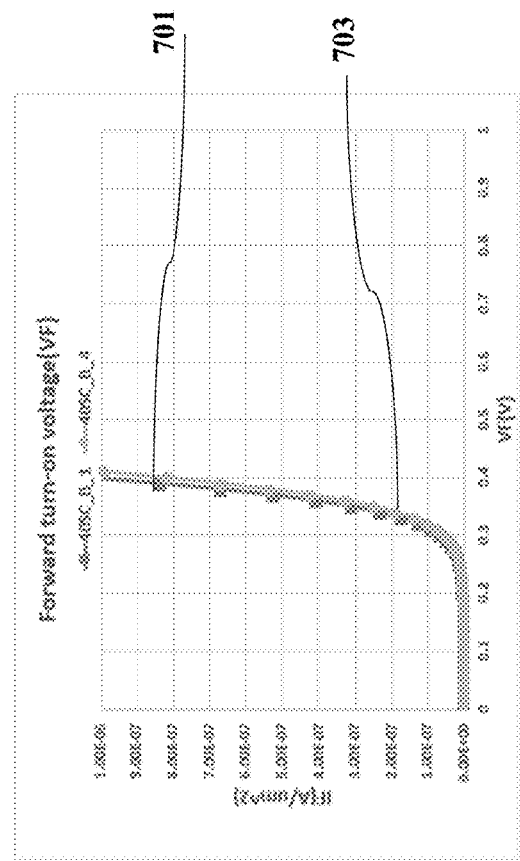
FIGS. 7A and 7B show the forwarding voltages and breakdown voltages of the device of FIG. 1B, respectively.
Figure 7B:
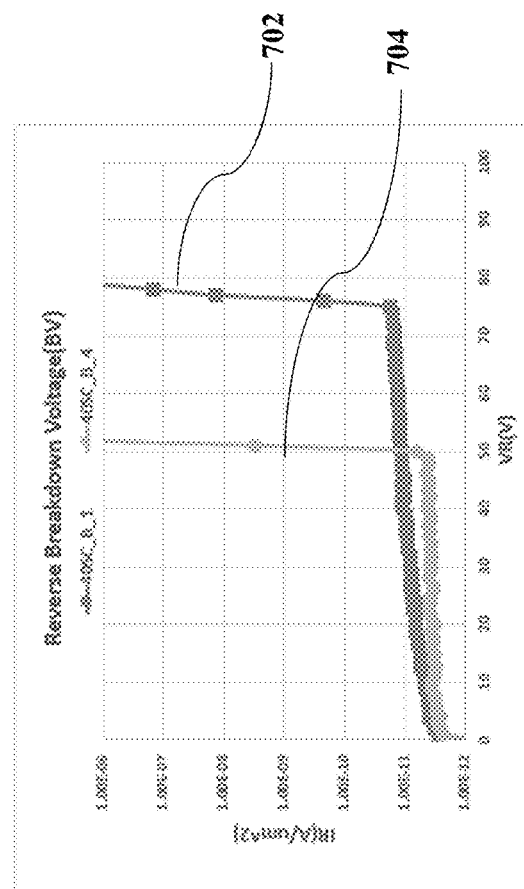

FIG. 7A shows the forwarding voltages of the device 100 of FIG. 1B when the anode length is 1.0 um and 1.4 um, and the length $S_s$ of plurality of gap portions is 1 um and equal to the length $S_w$ of the plurality of guardring portions of the first ring region 120b. FIG. 7B shows the breakdown voltages of the device 100 of FIG. 1B when the anode length is 1 um and 1.4 um, and $S_s$ is 1.4 um, smaller than $S_w$ which is 1.8 um. As it can be seen from Graph 701 and Graph 702 when the anode length, $S_s$ and $S_w$ are at 1 um, the forwarding voltage is 0.34V as the current is 0.1 uA and 0.40V as the current is 1 uA, and the breakdown voltage is 78V. As the anode length and $S_s$ increase to 1.4 um and $S_w$ increases to 1.8 um, Graph 703 shows that the forwarding voltage is 0.35V as the current is 0.1 uA and 0.42V as the current is 1 uA, and Graph 704 shows that the breakdown voltage is 50V. Accordingly, the forwarding voltage does not change significantly and the breakdown voltage increases as the anode length and $S_s$ decreases from 1.4 um to 1.0 um and $S_w$ decreases from 1.8 um to 1 um. Therefore, the anode length, $S_s$, $S_w$ can be varied to achieve optimum forwarding voltages and breakdown voltages from the present disclosure.

Figure 8C:
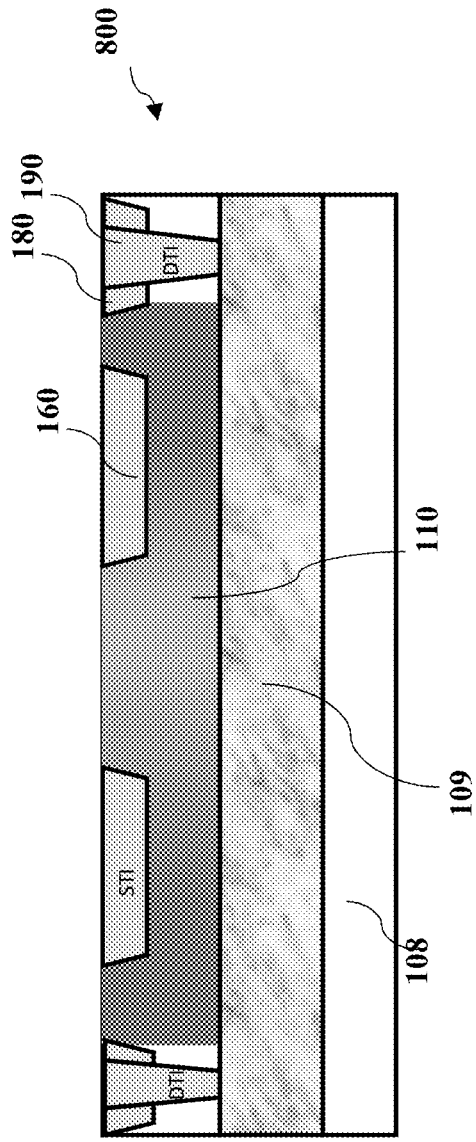

FIGS. 8A to 8D show simplified cross-sectional views that illustrate a method 800 for fabricating the device 100 according to various non-limiting embodiments. Referring to FIG. 8A, the method 800 may include providing a buried oxide layer 109 on a substrate 108 and providing a first region 110 on the buried oxide layer 109. Providing the first region 110 may include using a photoresist mask 810 when doping the first region 110 as shown in FIG. 8A and annealing the first region 110 after doping the first region 110 to allow the activation and diffusion of dopants as shown in FIG. 8B. For example, the photoresist mask 810 may have a pattern including a plurality of concentric ring patterns 811, 812, 813, 814 for providing a plurality of concentric ring portions 111, 112, 113, 114 in the first region 110, and the sizes of the ring patterns may increase in a radial direction from the center concentric ring patterns 811, 812, to the perimeter concentric ring pattern 814 corresponding to the thicknesses of the plurality of concentric ring portions 111, 112, 113, 114. It shall be appreciated that the number of the concentric rings shown is just for illustration and provides those skilled in the art with a convenient road map for fabricating the devices. For example, the center ring portion 111 of the first region 110 may be formed by doping the region in between the concentric ring patterns 811, 812. During doping the first region 110, the doping material is directed into the specific areas 820 where no patterns of the plurality of concentric ring patterns 811 to 814 exist, as shown by the arrows in 820. The plurality of the concentric ring patterns 811 to 814 may have sizes in a range from 0.22 um to 3 um and be spaced out by distances in a range of 0.18 um to 2.5 um.

Figure 8D:
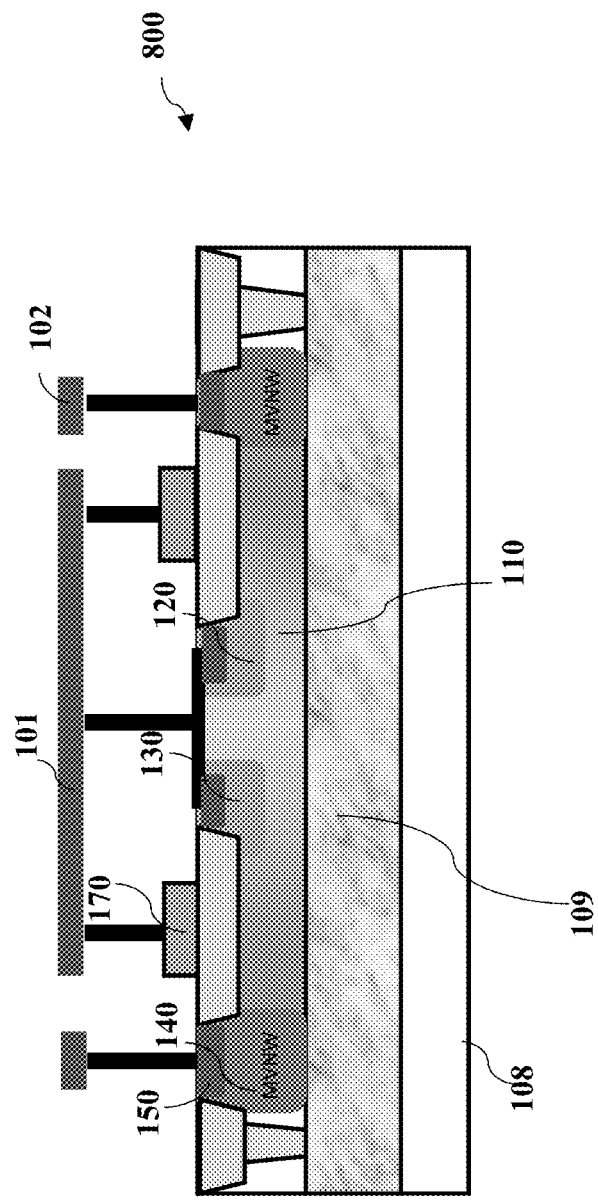

As shown in FIG. 8C, the method 800 may further include providing a first isolation region 160 and a second isolation 180 disposed in the first region 110, and providing a deep isolation region 190 being in direct contact with the buried oxide layer 109. As shown in FIG. 8D, the method 800 may further include providing a first ring region 120 and a second ring region 140 in the first region 110, providing a first terminal region 130 disposed in the first ring region 120 and a second terminal region 150 disposed in the second ring region 140, and providing a first field poly plate 170. The first terminal region 130 may be connected to the anode 101 and the second terminal region 150 connected to the cathode 102.

Figure 9:
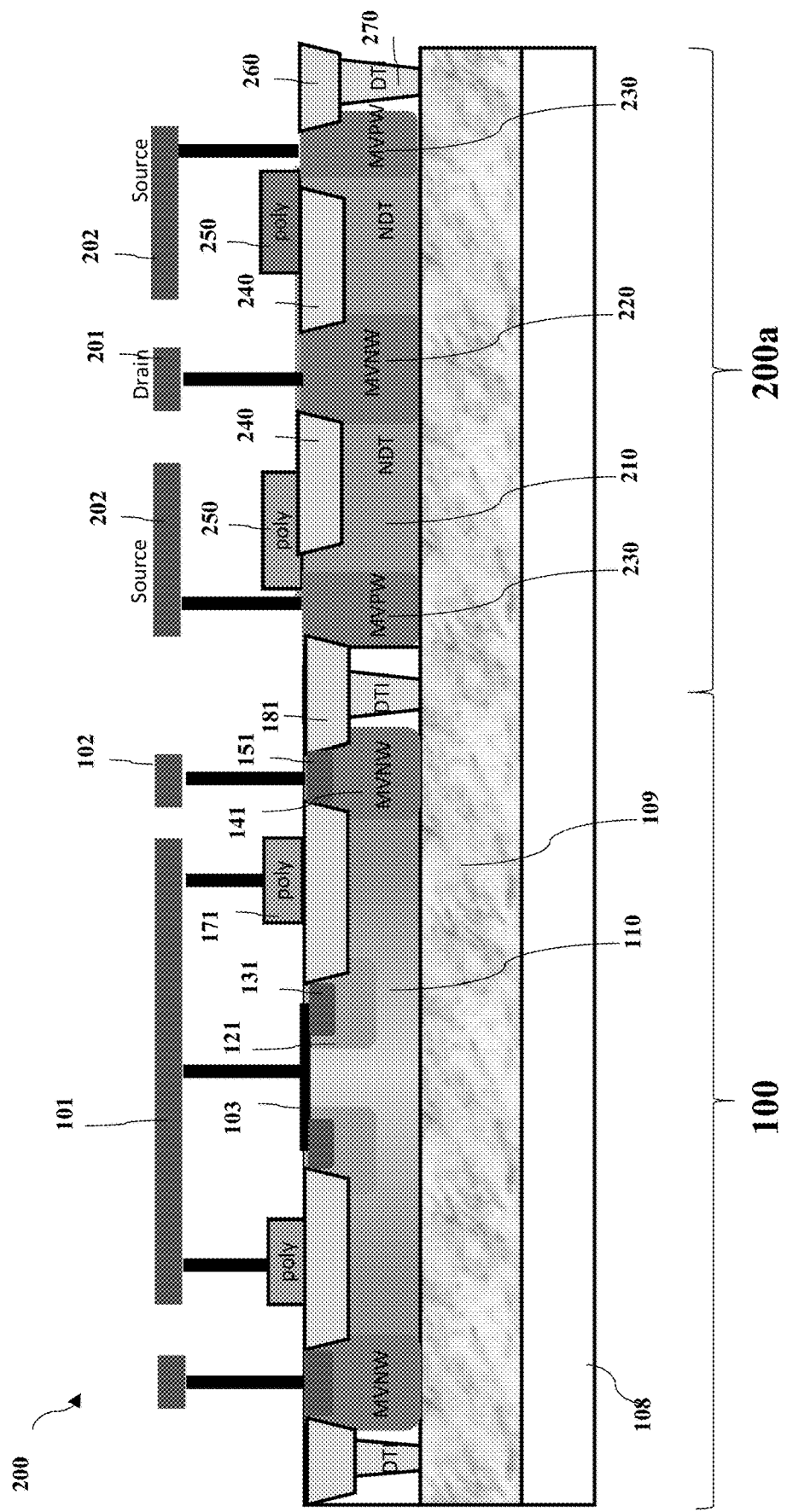
FIG. 9 shows a cross-sectional view of a device for high voltage applications according to various embodiments of the present disclosure.

Now referring to FIG. 9, a device 200 is presented according to other various non-limiting embodiments. The device 200 may include the features of the device 100 as described above in connection to FIG. 2, and therefore, the common features are labelled with the same reference numerals and need not be discussed. The device 200 may further include a Laterally Diffused N-type Metal Oxide Semiconductor (LDNMOS) region 200a, which includes a second region 210, and a third region 220 disposed in the second region 210, the third region 220 being connected to a drain 201 and in direct contact with the buried oxide layer 109. The second region 210 may be a draft region and the third region 220 may be a middle voltage well region.

The LDNMOS region 200a may further include a third ring region 230 disposed at least partially in the second region 210 and the third ring region 230 may be connected to a source 202 and in direct contact with the buried oxide layer 109. The third ring region 230 may be a middle voltage well region. The LDNMOS region 200a may also include a third isolation region 240 disposed in the second region 210 extending between the third region 220 and the third ring region 230. The third isolation region 240 may be in direct contact with the third region 220. A second end of the second isolation region 180 may be in direct contact with the third ring region 230, and the deep isolation region 190 may be located between the second ring region 140 and the third ring region 230. The second region 210 and the third region 220 may have a first conductivity type and the third ring region 230 may have a second conductivity type. The ring regions in the LDNMOS region 200a may be concentric with the ring regions of the device 100 that is the Schottky diode region. Alternatively, the ring regions in the LDNMOS region 200a may be concentric with the ring regions of the device 100 in accordance with operation voltage ratings.

The LDNMOS region 200a may further include a second field poly plate 250 disposed over the third isolation region 240, the second region 210 and the third ring region 230. The LDNMOS region 200a may also include a fourth isolation region 260 expanding from the third ring region 230 and an additional deep isolation region 270 in direct contact with the fourth isolation region 260 and the buried oxide layer 109.

Figure 10C:
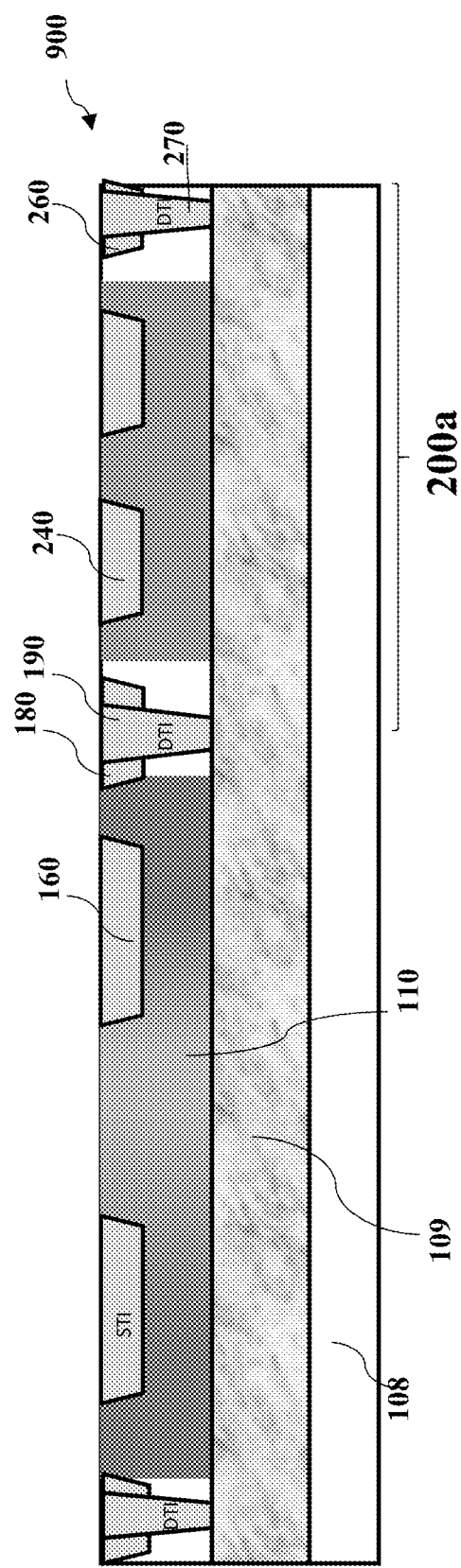

FIGS. 10A to 10D show simplified cross-sectional views that illustrate a method 900 for fabricating the device 200 according to various non-limiting embodiments. The method 900 may include the steps of the method 800 as described above in connection to FIGS. 8A to 8D. Referring to FIG. 10A, the method 900 may include providing a buried oxide layer 109 on a substrate 108 and providing a first region 110 on the buried oxide layer 109. The method may also include providing a second region 210 on the buried oxide layer 109. Providing the first region 110 may include using a photoresist mask 910 when doping the first region 110 and the second region 210 as shown in FIG. 10A and annealing after doping as shown in FIG. 10B. The photoresist mask 910 may have a pattern including a plurality of concentric ring patterns 911 to 914 configured to provide the plurality of concentric ring portions 111 to 114, and the sizes of the ring patterns may increase in a radial direction from the center ring patterns 911, 912 to the perimeter ring pattern 914, in a similar manner as the photoresist mask 810. The photoresist mask 910 may further include an opening 919 where the second region 210 is deposited with doping materials.

As shown in FIG. 10C, the method 900 may further include providing a first isolation region 160 and a second isolation 180 disposed in the first region 110, and providing a deep isolation region 190 being in direct contact with the buried oxide layer 109. The method 900 may also include providing a third isolation region 240, a fourth isolation region 260 and an additional deep isolation region 270.

Figure 10D:
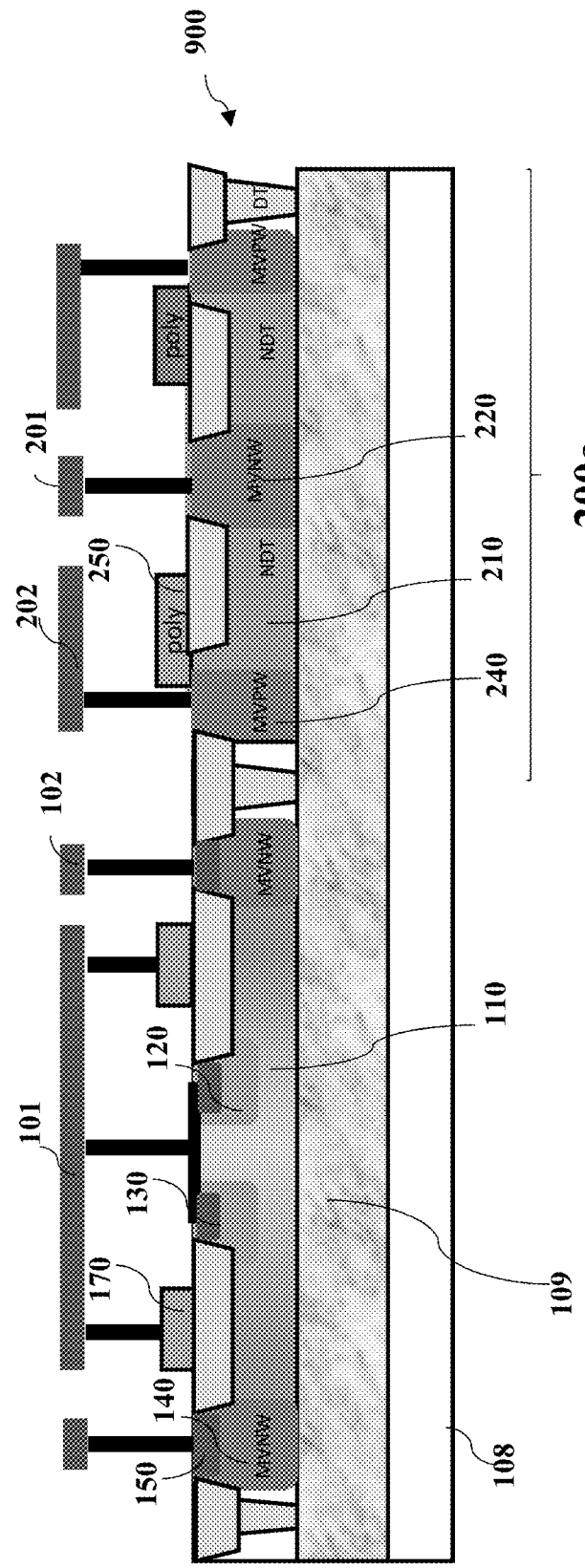

As shown in FIG. 10D, the method 900 may further include providing a first ring region 120 and a second ring region 140 in the first region 110, providing a first terminal region 130 disposed in the first ring region 120 and a second terminal region 150 disposed in the second ring region 140, and providing a first field poly plate 170.

The first terminal region 130 may be connected to the anode 101 and the second terminal region 150 connected to the cathode 102. The method 900 may also include providing a second region 210, a third region 220, a third ring region 230 and a second field poly plate 250. The third region 220 may be connected to a drain 201 and the third ring region 230 may be connected to a source 202.

The above described order for the method is only intended to be illustrative, and the method is not limited to the above specifically described order unless otherwise specifically stated.

In various non-limiting embodiments, the devices 100, 200 may be conventionally fabricated, for example, using known processes and techniques (e.g., growing epitaxial material and implanting impurities). For example, the p-type material may be or include, but is not limited to boron doped silicon as a material, and/or the n-type material may be or include, but is not limited to doped silicon material including phosphorus dopants, arsenic dopants, or combinations thereof.

Figure 11:
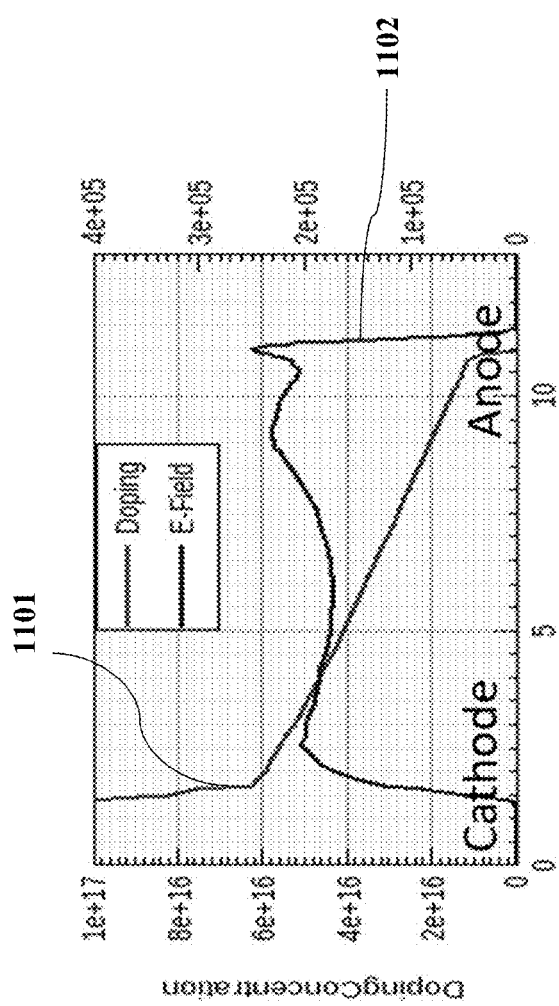
FIG. 11 shows the doping concentration and electrical field characteristics of a device for high voltage applications according to various embodiments of the present disclosure.

FIG. 11 shows the doping concentration and electrical field characteristics of the first region 110. Graph 1101 depicts a decreasing doping concentration across the first region 110 from the cathode side to the anode side. Graph 1102 depicts substantially uniform electrical field 1102 across the first region 110 from the cathode side to the anode side.

Various modifications can be made to the device 100 as described herein. Similar modifications as those described with reference to device 100 may be made to devices 200.

For example, the distances between the ring portions 111 to 116 of the first region 110 as shown in FIGS. 1A and 1B may be varied. By varying these distances, the lateral graded junction in the first region 110 is varied and therefore the breakdown voltages of the device 100 can be adjusted to a desired level. In an example, the distance between any two ring portions of the first region 110 may be zero, that is, the two ring portions are in direct contact with each other. In an example, two adjacent ring portions may be overlapped, that is, there is no visible boundary between the two adjacent ring portions of the first region 110. The variation of the distances varies the breakdown voltages with greater distance between two ring portions resulting in higher breakdown voltage. By reducing the distance between two ring portions, the breakdown voltages can be reduced. The device 100 provides scalable breakdown voltages for high voltage applications.

Further, the thicknesses of the ring portions of the first region 110 may be varied, and the electrical characteristics and performance of the device 100 may be varied accordingly. The difference between the thicknesses of two adjacent ring portions can be also varied, whereby the graded doping concentration of the first region 110 may be varied.

In FIG. 2 and the description set forth, the first region 110, the second ring region 140, the second terminal region 150 are indicated as n-doped conductivity; and the substrate 108, the first ring region 120 and the first terminal region 130 are indicated as p-doped conductivity. It can be understood by a person skilled in the art that the first region 110, the second ring region 140, the second terminal region 150 can have a different conductivity or an opposite conductivity, e.g. p-doped conductivity; and that the substrate 108, the first ring region 120 and the first terminal region 130 can have a different conductivity, e.g. n-doped conductivity. Furthermore, in FIG. 9, the second region 210 and the third region 220 are shown as n-doped conductivity region, and it can be understood that they can be a different conductivity as discussed herein. Similarly, the third ring region 230 is shown as p-doped conductivity region, and it can be understood that it can be a different conductivity as discussed herein. The device 100 may also be modified such that only some regions are replaced with respective regions of an opposite conductivity type. For instance, the substrate 108 can be replaced with an n-type substrate, while the conductivity type of the rest of the device 100 remains the same. It would be clear to a person skilled in the art that the directions of current flows will change accordingly when the conductivity types of the various regions are reversed.

In various non-limiting embodiments, the first terminal region 130 and the second terminal region 150, may include one or more dopants or combinations thereof and may have the same doping concentrations (i.e. same concentration of dopants) or different doping concentrations (i.e. different concentrations of dopants) from each other. The highest doping concentration of the graded doping concentration of the first region 110 may be lower than the doping concentration of the second ring region 140. That is, the doping concentration of the second ring region 140 is higher than the highest doping concentration of the graded doping concentration of the first region 110.

The doping levels of the various regions may be varied, the electrical characteristics and performance of the devices 100, 200 as described herein will be varied accordingly.

Furthermore, the positioning of the regions of the device 100 may be varied and one region may be partially or fully within another region. For instance, the second ring region 140 may be partially or fully within the first region 110.

The isolation regions 160, 180, 190, may be positioned differently. The cross-sectional view of the isolation regions 160, 180, 190, may be any shape other than trapezoid. The sizes of the isolation regions 160, 180, 190, may be adjusted to be less or larger in the lateral direction or in the vertical direction.

In addition, the surfaces of the devices 100, 200, are not intended to limit to flat surfaces. In various non-limiting embodiments, the surfaces of the devices 100, 200, can be curved surfaces.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

The invention claimed is:

1. A device comprising:
   a buried oxide layer disposed on a substrate;
   a first region disposed on the buried oxide layer;
   a first ring region disposed in the first region;
   a first terminal region disposed in the first ring region;
   a second ring region disposed in the first region around the first ring region;
   a second terminal region disposed in the second ring region;
   wherein the first region has a graded doping concentration, wherein the doping concentration of the first region increases in a radial direction from a center of the first region to a perimeter of the first region;
   wherein the first region, the second ring region, and the second terminal region have a first conductivity type;
   wherein the first ring region and the first terminal region have a second conductivity type; and wherein the first conductivity type is different from the second conductivity type.

2. The device according to claim 1, wherein the first region has a rounded shape and wherein the doping concentration of the first region is lowest at a center of the first ring region and gradually increases in a radial direction towards the second ring region at the perimeter of the first region.

3. The device according to claim 1, wherein the first region comprises a plurality of concentric ring portions, and wherein the plurality of the concentric ring portions is located concentric with the first ring region and the second ring region.

4. The device according to claim 3, wherein the first region further comprises a plurality of substrate portions in between the plurality of concentric ring portions.

5. The device according to claim 1, wherein the first ring region comprises a guardring and wherein the second ring region is disposed at the perimeter of the first region and contacts the buried oxide layer and wherein a depth of the first ring region is less than a depth of the second ring region.

6. The device according to claim 1, further comprises:
   a first isolation region disposed in the first region, an inner edge of the first isolation region being in direct contact with the first ring region, an outer edge end of the first isolation region being in contact with the second terminal region and the second ring region.

7. The device according to claim 6, further comprising:
   a first field poly plate disposed over the first isolation region, the first field poly plate being connected to an anode.

8. The device according to claim 7, wherein the first field poly plate is disconnected with the first and second terminal regions.

9. The device according to claim 1, wherein the first ring region comprises a discontinuous guardring portion.

10. The device according to claim 9, wherein the discontinuous guardring portion comprises a plurality of guardring portions spaced apart by a plurality of gap portions.

11. The device according to claim 10, wherein the plurality of guardring portions has a length larger than a length of the plurality of gap portions.

12. The device according to claim 1, further comprising:
    a second isolation region at least partially disposed in the first region, the second isolation region extends laterally from the second ring region, a first end of the second isolation region being in direct contact with the second terminal region and the second region; and
    a deep isolation region in direct contact with the second isolation region and extending to the buried oxide layer.

13. The device according to claim 1, further comprising a silicide layer disposed over the first terminal region, the first ring region and a center of the first region, wherein the first terminal region is configured to be connected to an anode through the silicide layer.

14. The device according to claim 12, wherein the device further comprises:
    a second region;
    a third region disposed in the second region, the third region being connected to a drain and in direct contact with the buried oxide layer;
    a third ring region disposed in the second region, the third ring region being connected to a source and in direct contact with the buried oxide layer; and a third isolation region disposed in the second region extending between the third region and the third ring region, the third isolation region being in direct contact with the third region, wherein a second end of the second isolation region is in direct contact with the third ring region;

wherein the deep isolation region is located between the second ring region and the third ring region;

wherein the second region and the third region have the first conductivity type; and wherein the third ring region has the second conductivity type.

15. The device according to claim 14, further comprising a second field poly plate disposed over the third isolation region, the second region and the third ring region.

16. The device according to claim 1, wherein the first and second terminal regions comprise first and second terminal ring regions, the first terminal ring region configured to connect to an anode and the second terminal ring region configured to connect to a cathode.

17. The device according to claim 1, wherein a doping concentration of the second ring region is lower than a doping concentration of the first region.

18. The device according to claim 1, wherein the first region is a drift region.

19. A method for manufacturing a device, comprising:
providing a buried oxide layer on a substrate;
providing a first region on the buried oxide layer;
providing a first ring region in the first region;
providing a second ring region in the first region around the first ring region; and
providing a first terminal region disposed in the first ring region and a second terminal region in the second ring region,
wherein providing the first region comprises:
using a photoresist mask when doping the first region; and
annealing the first region after doping the first region;
wherein the first region has a graded doping concentration, wherein the doping concentration of the first region increases in a radial direction from a center of the first region to a perimeter of the first region;
wherein the first region, the second ring region, and the second terminal region have a first conductivity type; wherein the first ring region and the first terminal region have a second conductivity type; and wherein the first conductivity type is different from the second conductivity type.

20. The method of claim 19, wherein the photoresist mask has a plurality of concentric rings, wherein sizes of the plurality of concentric rings increase in a radial direction away from a centre.

* * * * *